United States Patent [19]
McKenna

[11] 4,417,234
[45] Nov. 22, 1983

[54] MULTIPLEXED ANALOG TO DIGITAL CONVERTER HAVING A FEEDBACK STABILIZED RAMP

[75] Inventor: Joseph V. McKenna, Franklin Lakes, N.J.

[73] Assignee: The Singer Company, Little Falls, N.J.

[21] Appl. No.: 326,874

[22] Filed: Dec. 3, 1981

[51] Int. Cl.³ .......................................... H03K 13/20
[52] U.S. Cl. ..................... 340/347 AD; 340/347 NT; 340/347 CC; 364/453
[58] Field of Search ................. 340/347 AD, 347 CC, 340/347 NT; 364/453, 454

[56] References Cited
U.S. PATENT DOCUMENTS

| | | | |
|---|---|---|---|
| 3,389,271 | 6/1968 | Gray | 340/347 NT |
| 3,613,112 | 10/1971 | Kanter | 340/347 CC |
| 3,750,142 | 7/1973 | Barnes | 340/347 CC |
| 3,879,724 | 4/1975 | McDonald | 340/347 AD |
| 3,900,843 | 8/1975 | Ferriss | 340/347 AD |
| 4,118,698 | 10/1978 | Becker | 340/347 CC |

Primary Examiner—C. D. Miller
Attorney, Agent, or Firm—Thomas W. Kennedy

[57] ABSTRACT

A multiplexed analog-to-digital converter is provided for use in an inertial navigation system comprising a multiplexer, a buffer, a feedback stabilized ramp generator and a comparator controlling a gated counter whose digital output is representative of the analog input signal.

3 Claims, 3 Drawing Figures

MULTIPLEXED ANALOG TO DIGITAL CONVERTER HAVING A FEEDBACK STABILIZED RAMP

PRIOR ART

| U.S. Pat. No. | Inventor | Date |
| --- | --- | --- |
| 3,389,271 | J. W. Gray | 6/18/68 |

BACKGROUND OF THE INVENTION

The present invention relates to a multiplexed analog-to-digital converter, and particularly to a multiplexed analog to digital converter having a feedback stabilized ramp.

The converter according to the invention is a multi-channel, multiplexed analog-to-digital converter with day-to-day bias stability in the sub-microvolt range. A primary application is found in digitization of restoring currents in the gyro and accelerometer control loops of inertial guidance systems.

A prior art, analog-to-digital converter is shown in U.S. Pat. No. 3,389,271 of inventor J. W. Gray, issued June 18 1968, and assigned to the same assignee as this invention. In such a converter the unknown current is divided through a sense resistor and through a summing resistor to an electronic integrator which is reset by current pulses of precisely known charge. This is classed as voltage-to-frequency (V/F) converter.

The problem of the prior art device is that it employs precision balancing pulses which are normally long with respect to rise and fall time of analog switching devices, thus limiting maximum pulse frequency, hence resolution.

SUMMARY OF THE INVENTION

In accordance with one embodiment of the present invention, the resolution of conversion is improved because this resolution is limited only by the frequency limitation of logic elements in the converter.

Accordingly, it is one object of the invention to provide an analog-to-digital converter wherein the resolution of conversion is limited only by the frequency limitation of the logic elements in the converter.

It is another object of the invention to provide an analog-to-digital converter having multiplexing capability thereby lowering cost and minimizing the size while providing multiple channel conversions.

It is a further object of the invention to provide a multiplexed analog-to-digital converter, which has a bias stabilization loop from digital output, rather than only around an analog section in the input section.

Further objects and advantages of the present invention will become apparent upon reading the following description and the drawings.

DESCRIPTION OF THE INVENTION

Figure 1:
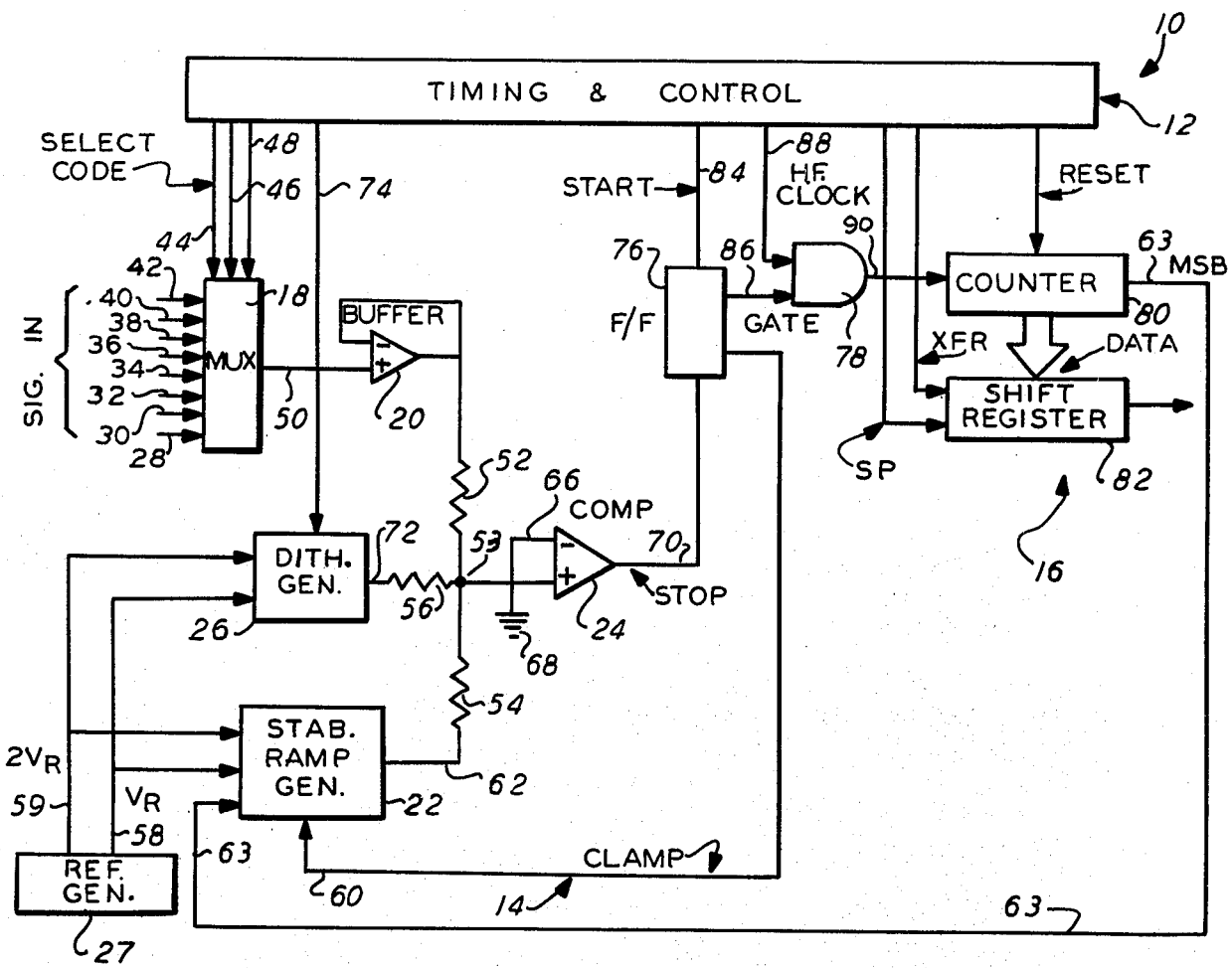
FIG. 1 is a schematic block diagram of an analog-to-digital converter according to the present invention.

In FIG. 1, a stabilized ramp converter 10 (SRC) is shown, which is one embodiment of the present invention. Ramp converter 10 includes a timing and control section 12, an analog section 14, and an output section 16. Converter 10 is a basic stabilized ramp converter (SRC).

Figure 2:
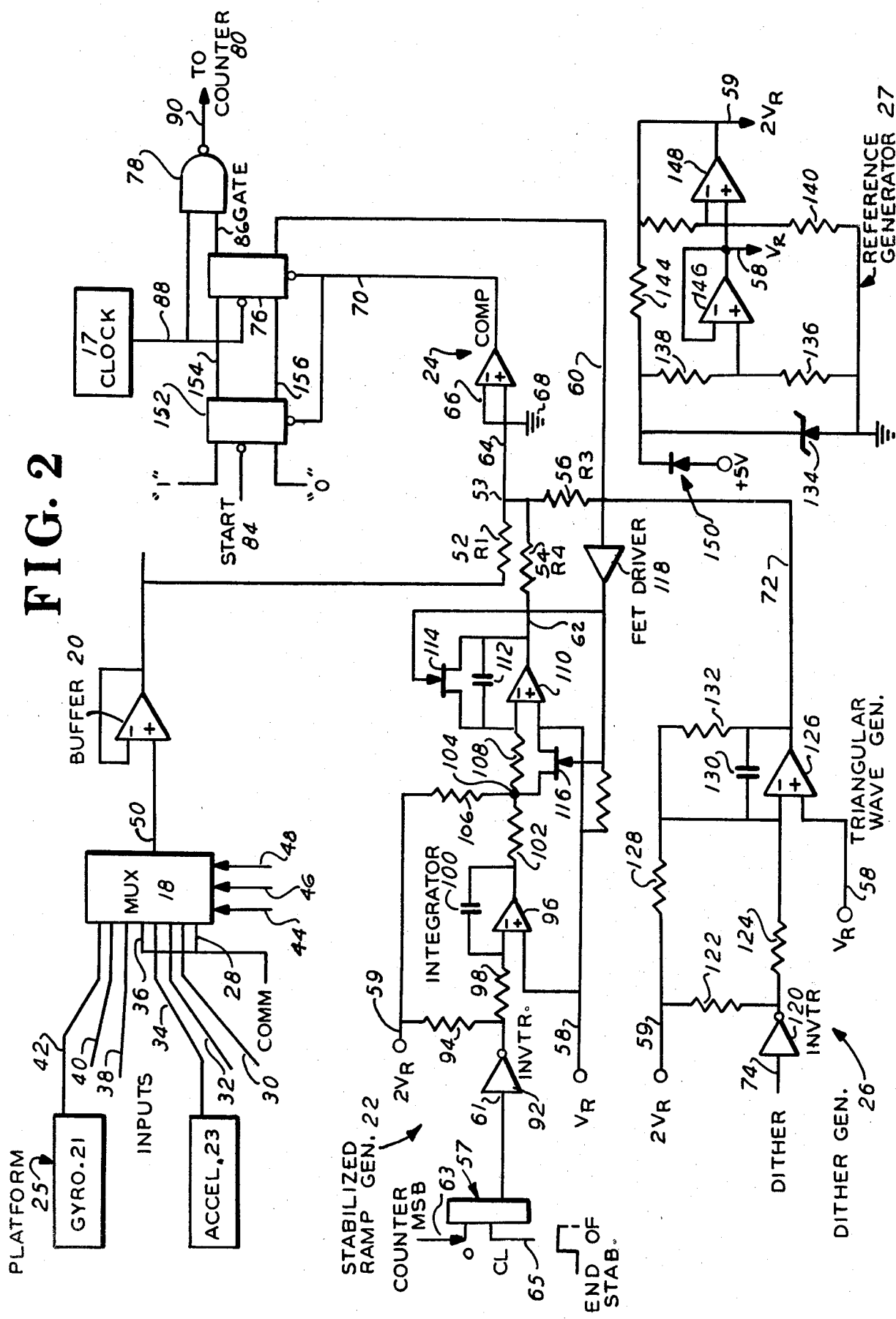
FIG. 2 is a more detailed block diagram of a portion of the analog-to-digital converter of FIG. 1.

Timing and control section 12 contains a high frequency oscillator (not shown) which supplies a high frequency clock 17 (see FIG. 2). The countdown of clock 17 provides timing signals, which control the operation and sequence of analog section 14 and output section 16.

Analog section 14 includes a multiplexer 18, a buffer 20, a ramp generator 22, a comparator 24, a dither generator 26, and a reference generator 27, as explained hereafter.

Analog section 14 also includes a gyroscope 21 and an accelerometer 23, which connect to multiplexer 18, and which are components of an inertial guidance system platform 25.

Multiplexer 18 is supplied a channel select code from timing and control section 12, in order to select one of eight (8) signals connected to its input.

The multiplexer 18 output feeds the selected signal to buffer 20. The output of buffer 20 and of ramp generator 22 and of dither generator 26 are summed at the input of comparator 24.

A reference generator 27 feeds a reference voltage $V_R$, and a voltage at twice this level, $2 V_R$, to the dither generator 26 and the ramp generator 22.

Analog section 14, as shown in FIG. 1, includes eight signal input leads 28, 30, 32, 34, 36, 38, 40, 42, which provide input signals to multiplexer 18. Analog section 14 also includes three channel select leads 44, 46, 48, which determine which of the input channels is selected by the multiplexer 18. Multiplexer 18 also has an output line 50, which connects to buffer 20. Input leads 28 and 36 of multiplexer 18 connect to ground. Input lead 42 connects to gyroscope 21 of platform 25. Input lead 34 connects to accelerometer 23 of platform 25. The structure is described now, and the operation is described later herein.

Buffer 20 connects to an R1 signal summing resistor 52, which connects to an R2 ramp summing resistor 54, and an R3 dither summing resistor 56, at junction 53.

Reference generator 27 has a reference voltage line 58, and also a second reference voltage line 59, which has a voltage twice the voltage of line 58. Lines 58 and 59 of reference generator 27 connect to corresponding lines 58 and 59 adjacent to the dither generator 26, and connect to corresponding lines 58 and 59 adjacent to the ramp generator 22.

Ramp generator 22, as shown in FIG. 2, has a D-type control flip flop 57, which has a servo line 61 for its output. Its D input is on input line 63 and its clock input is on input line 65.

Ramp generator 22, as shown in FIG. 1, has a clamp control line 60, which connects to output section 16, and a ramp generator output line 62.

Comparator 24 has a non-inverting input line 64, and an inverting input line 66, which is connected to signal ground 68, and a stop output line 70, as explained hereafter. The output of comparator 24 changes state from logic one to logic zero as the sum of the currents in resistors 52, 54, 56 becomes negative. That is, as ramp voltage is equal and opposite to the sum of the buffered input signal and the dither voltage.

Dither generator 26 has a dither generator output line 72, and a dither reference frequency line 74. The structure is described now, and the operation is described later herein.

Output section 16 includes a gate control flip flop 76, a gate 78, a counter 80, and a shift register 82.

Flip flop 76 has a set input, which is fed from a start signal line 84, and a reset input, which is fed from the stop signal line 70. Flip flop 76 also has an output line 86, which enables gate 78.

Gate 78 has a clock input line 88, and a gated clock output line 90.

Referring to FIG. 2, ramp generator 22, dither generator 26, and reference generator 27 are shown in more detail. The structure is described now, and the operation is described later herein.

Ramp generator 22 includes the control flip flop 57, which is clocked at the end of each stab (stabilizing) conversion, that is, the conversion resulting while the multiplexer selects signal ground as an input. The condition of the output after clocking depends upon the state of the most significant bit of the gated counter 80. The output of the flip flop is introduced to the input of an open collector inverter 92.

The ouput of inverter 92 is pulled up to 2 $V_R$ of line 59 through a resistor 94 and introduced to an integrator amplifier 96 through an input resistor 98. Amplifier 96 has a feedback capacitor 100, which is connected to perform an integration of the input signal.

The output of amplifier 96 is introduced through resistor 102 to the junction 104 of resistor 106 and resistor 108, which supply primary current to summing amplifier 110, which has a feedback capacitor 112 that is connected to perform an integration of the input signal.

Generator 22 has a first FET switch 114, which is across capacitor 112 in order to provide a low resistance path across capacitor 112 when the clamp voltage in line 60 is positive, and includes a second FET switch 116, which provides a low resistance path from junction 104 to the reference line 58 when the clamp voltage in line 60 is positive. Thus, when clamp voltage 60 is positive, the output of amplifier 110 is clamped to $V_R$ line 58. When the clamp voltage 60 is negative, a FET driver 118, whose input is line 60, pulls the gates of FET switch 114 and FET switch 116 negative. Thus, this causes their resistance to approach infinity, and amplifier 110 output begins to ramp downward, due to primary current supplied through resistor 106 and vernier current supplied through resistor 102, from amplifier 96.

The operation described above provides a vernier current from amplifier 96, which modifies the slope of the ramp output of amplifier 110, such that nominally fifty percent of stab conversions result in a logic one as the most significant bit of the gated counter. The remainder of the conversions result in a logic zero output. Hence, average count in gated counter for stab (stabilizing) conversion is one half LSB (least significant bit) less than one half the counter capacity. This is an important feature of converter 10.

The output of amplifier 110 is fed through resistor 54 to the summing junction 64 of the comparator 24.

Dither generator 26 includes an open collector inverter 120, whose input is derived from dither reference line 74, and whose output is pulled up to 2 $V_R$ of line 59 by a resistor 122. The inverter output is introduced through a resistor 124 to a summing junction 125 of amplifier 126.

Also connected to the summing junction 125 of amplifier 126 is a resistor 128 from the 2 $V_R$ line 59. A capacitor 130 and a resistor 132, in parallel, are connected to the output of amplifier Thus, the dither frequency introduced on line 74 causes amplifier 126 output to excurse an approximate triangular wave at the dither frequency. The output of amplifier 126 is fed through resistor 56 to the summing junction 64 of the comparator 24.

Reference generator 27 includes a zener reference diode 134, and a divider, composed of resistor 136 and resistor 138.

Another section of the reference generator comprises a resistor 140, a resistor 142, a feedback resistor 144, an operational amplifier 146, and an amplifier 148, which are arranged so as to supply the reference voltage $V_R$ on line 58 and twice the reference voltage 2 $V_R$ on line 59.

A diode 150 is connected from a +5 V source, so as to insure startup of the reference supply.

Flip flop 76, as shown in FIG. 2, is more complex than as shown in FIG. 1. An additional flip flop 152 is employed to synchronize the start of the ramp as controlled by line 60, and the enabling of the counter 80 as controlled by line 86, to the high frequency clock output line 88.

Synchronization is accomplished by setting of flip flop 152 with the start signal on line 84. Flip flop 152 has output line 154 and output line 156, which prepare flip flop 76 to be set upon the negative going edge of the subsequent clock pulse on line 88. Thus, the first count in counter 80 occurs one-half clock period after flip flop 76 is set.

Counting of the high frequency clock 17 continues in the counter 80 until the output of the comparator line 70 goes to logic zero, thus resetting flip flops 152 and 76. The number accumulated in counter 80 is then a measure of the selected input signal amplitude.

The operation of converter 10 is further explained hereafter. Converter 10 is a basic ramp converter as shown in FIG. 1. Ramp generator 22 is clamped to a reference voltage, $V_R$, while the input signal (voltage) to be converted is selected in the multiplexer (MUX) 18 and introduced to buffer 20. A START pulse, generated in the timing and control (T&C) section 12, sets flip-flop (F/F) 76 one of whose outputs gates a high frequency clock 17 into counter 80 and simultaneously starts the downward slope of the ramp generator 22. As the ramp reaches the amplitude, but opposite polarity, of the buffered input signal, comparator 24 fed by these signals changes state and resets flip-flop 76, thereby inhibiting any further counting. The accumulated count is therefore proportional to the time between ramp start and comparator trip (crossover). The relationships are as follows:

Ramp Voltage $v_R = V_R - st$ where
$V_R$ = reference voltage
s = ramp slope
t = time
Crossover occurs when $v_R = -V_{SIG}$ $$V_R - st = -V_{SIG}$$

-continued
$$s t = V_R + V_{SIG}$$

$$t = T = \frac{V_R + V_{SIG}}{s}$$

If clock frequency is $f_{CL}$, the counter accumulates:

$$C = f_{CL}T = \frac{f_{CL}}{s}(V_R + V_{SIG})$$

$$V_{SIG} = \frac{sC}{f_{CL}} - V_R$$

While $V_R$ and $f_{CL}$ may be very precisely generated, using a thermally controlled reference diode 134 for the former and a crystal oscillator 17 for the latter, the slope, s, of a ramp generator 22 is not easily stabilized with currently available components.

Ramp generators generally employ a voltage source, $V_G$, applied across a resistance, $R_G$, to generate a current $I_G$, which, in turn, charges a capacitor, $C_G$, thus producing a voltage ramp across the capacitor with a slope of $I_G/C_G$ volts/sec. Therefore ramp slope is directly affected by drifts in $V_G$, $R_G$ and $C_G$. The converter (SRC) 10 of the invention compensates for these drifts by the utilization of stabilization (STAB) intervals in the converter timing, during which the MUX 18 selects signal ground, rather than an active input signal, for conversion. If the measurement by SRC 10 of this STAB signal indicates a positive level equal to or greater than zero volts a control flip-flop 57 is set, otherwise reset. This flip-flop's output feeds an integrator, including parts 92, 94, 96, 98, 100, whose output supplies a vernier current added to the ramp generator's primary $I_G$ in line 106 to control ramp slope. (See FIG. 2). The state of flip-flop 57 will change after each STAB cycle wherein the digital measurement indicates a change of polarity of the sampled zero volts signal. There exists, then, a limit cycle wherein half the STAB conversions reflect a zero or positive measurement and half reflect a negative measurement. The average digital result of the STAB conversions (or any other input channels which are at zero volts) will be $-0.5$ LSB where an LSB is the least significant bit of the converter's output.

The uses of which the SRC 10 are intended are those for which the average of output readings is critical, so that a cycling of the LSB in successive conversions is not necessarily objectionable. In order that the average output of the SRC 10 be correct, $\frac{1}{2}$ LSB should be digitally added to each conversion. Adding 1 LSB to alternate conversions is equally acceptable.

To minimize the effects of quantization error in the average SRC 10 output a "dither" signal on line 72 is summed into the comparator 24 circuit with the ramp and buffered input signals.

Figure 3:
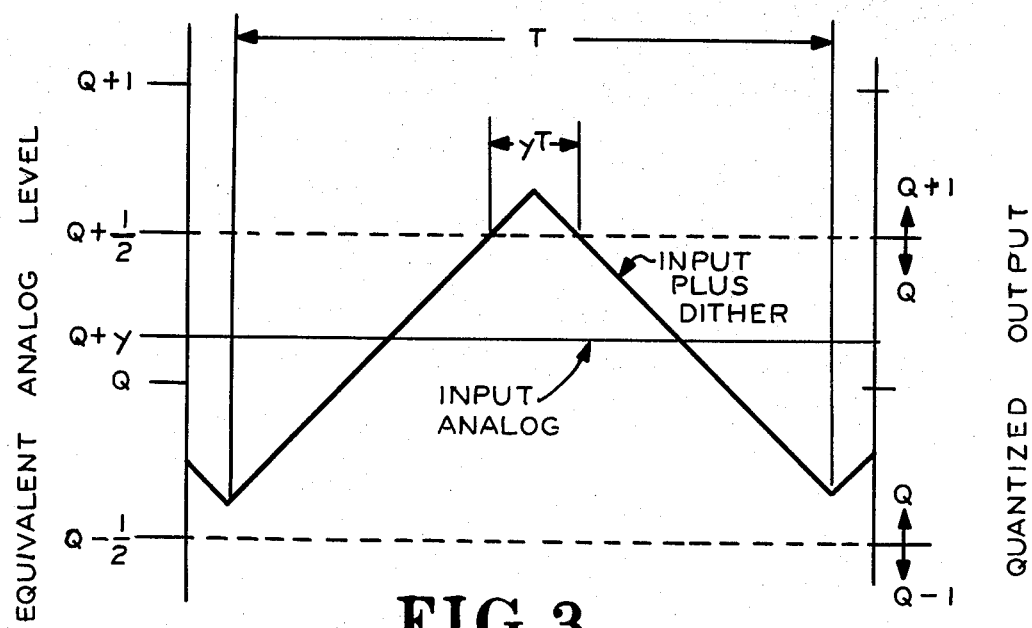
FIG. 3 is a representation of a dither waveform in the dither generator of the converter.

Note that, in an ideal, noiseless converter, the proper digital output for analog inputs from $-\frac{1}{2}$ LSB to $+\frac{1}{2}$ LSB equivalents would always be zero, i.e., dead bands exist wherein small changes in the analog input are not evidenced in the digital output. The triangular dither employed in the SRC 10 minimizes this dead band effect on average data, as illustrated in FIG. 3. In order that the dither signal be of maximum effectiveness, it must be an integral number of LSB in equivalent input signal amplitude, have very linear slopes and be of a different frequency than that at which a particular channel is converted. If exactly N (an integer) conversions of a dc voltage occur in exactly M (an integer) dither cycles (where neither M/N nor N/M are integers) and dither amplitude is exactly Z (an integer) LSB peak-to-peak in equivalent amplitude, average quantizing error amplitude for dc input signals becomes Z/2N LSB rather than $\frac{1}{4}$ LSB, as it would be without dither, with the average accumulated over N conversions. Unavoidable electrical noise in the input, ramp and dither signals, as well as in the comparator's front end, add another dither effect, further reducing effective dead bands, but prolonging the period over which conversions must be averaged to achieve a specified resolution of the digital result.

Referring to FIG. 3, the applicable formula for average output is:

$$D_{av} = \frac{(Q + 1)yT + Q(1 - y)T}{T} = Q + y$$

where analog input is equivalent to (Q+y) least significant bits (y is a fraction of an LSB).

An implementation of the SRC concept is illustrated in FIG. 2. In this design, an 8 channel MUX 18 was employed, selecting one of 6 active input channels and 2 STAB channels in a fixed sequence.

The input 61 to the inverter 92 is derived from flip-flop 57 as shown in FIG. 2. The "dither" input to the inverter 120 is a square wave derived in a countdown circuit (not shown) from the 52.4288 MHz master clock 17. The reference generator 27 shown supplies $V_R$ and $2 V_R$ voltages as required in other sections of the converter. The schematic includes the essential elements of a particular implementation of the SRC techniques.

One prototype of converter 10 has the detailed components as indicated hereafter.

| RESISTORS | | AMPLIFIERS | |
|---|---|---|---|
| 52 | 1.3K | 20 | BUF-02 (PMI) |
| 54 | 1.3K | 96 | OP-16 (PMI) |
| 56 | 5.6M | 110 | OP-16 (PMI) |
| 94 | 10K | 130 | OP-16 (PMI) |
| 98 | 22M | 146 | OP-16 (PMI) |
| 102 | 8.2M | 148 | OP-16 (PMI) |
| 106 | 39K | CAPACITORS | |
| 108 | 39K | 100 | 0.1MF |
| 122 | 3K | 112 | 2000 PF |
| 124 | 56K | 130 | 0.01 MF |
| 128 | 1.5M | | |
| 132 | 1.5M | | |
| 136 | 4.99K | | |
| 138 | 1.4K | | |
| 140 | 4.99K | | |
| 142 | 4.99K | | |
| 144 | 1.8K | | |
| Multiplexer: CD4051 (RCA) | | | |
| Comparator: LM161D (Nat'l) | | | |
| Dual Flip Flop 76/154: 54S113 | | | |
| Flip Flop 57: 54LS74 | | | |
| Gate: 54LS00 | | | |
| Inverters: 92 & 120: 54LS26 | | | |
| Counter 80: | | | |
| 1st Section: 54S197 | | | |
| Remaining Sections: 54LS393 | | | |
| J-FETS 114 & 116: 2N4391 | | | |
| Clock 17: 49.92 MHz (MF Electronics) | | | |

The test data of one prototype of converter 10 is indicated hereafter.

| SRC OFFSET STABILITY VS. TIME OFFSET IN PPM OF FULL SCALE | | | | | | | |
|---|---|---|---|---|---|---|---|
| | TEST TIME IN MINUTES | | | | | | |
| CHANNEL | 12 | 955 | 135 | 72 | 130 | 1221 | 103 |
| 1 | +8.3 | +8.3 | +8.6 | +8.5 | +8.5 | +8.4 | +8.1 |
| 2 | −2.4 | −2.7 | −2.6 | −2.8 | −2.4 | −2.4 | −2.6 |
| 3 | +1.3 | +0.8 | +1.1 | +1.1 | +0.9 | +1.0 | +1.0 |
| 4 | +7.8 | +7.6 | +7.5 | +7.6 | +7.6 | +7.5 | +7.4 |
| 5 | +3.1 | +2.9 | +2.7 | +2.7 | +2.6 | +2.7 | +2.7 |
| 6 | +6.5 | +6.5 | +6.3 | +6.4 | +6.4 | +6.3 | +6.2 |
| AV. | +4.2 | +3.9 | +4.0 | +3.9 | +3.9 | +3.9 | +3.8 |

NOTES:
[1]MUX removed and output grounded, MUX select code removed from cabling.
[2]Tests run between 7 PM on 1/7/80 and 4 PM on 1/9/80.
[3]Probable ambient temperature variation: 3° C. peak-to-peak.
[4]Clock employed was 24 MHZ rather than 26.2144 MHZ.
[5]Dither frequency: 400 HZ The advantages of the invention are explained hereafter.

A primary advantage of the SRC 10 over other conversion methods is its multiplexing capability, hence potentially lower cost and smaller size in those systems wherein multiple channel conversions are required. Another advantage, specifically over analog-to-frequency (A/C) converters, is improved resolution of conversion in that this resolution is limited only by the frequency limitation of logic elements in the SRC, whereas A/F techniques employ precision balancing pulses which are normally long with respect to rise and fall time of analog switching devices, thus limiting maximum pulse frequency, hence resolution. In addition, the SRC 10 provides a bias stabilization loop from digital output itself rather than only around an analog section in the input section, as is done with chopper stabilized amplifiers in many other conversion approaches.

The SRC 10 also facilitates the implementation of auto-scaling of its input, when used as a current-to-digital converter, by electrical switching of sense resistors during "non-aperture" intervals of signal effected, thus avoiding signal discontinuities and charge injection effects caused by switching.

Alternate methods of construction are explained hereafter. Alternate SRC schemes might employ (a) a negative reference voltage and positive ramp, (b) a signal buffer with a gain greater than unity to increase sensitivity, (c) a summation of the dither and MUX output in the buffer input circuit, with the comparator arranged to sense the difference of the ramp and signal-plus-dither signal, rather than the sum of the ramp, signal and dither, and connecting these signals to different input terminals of the comparator and removing the comparator summing resistors (which trades off resistor matching inaccuracies with comparator's common mode rejection ratio deficiencies), (d) other means of clamping and unclamping the ramp generator, and/or (e) alternate types for operational amplifiers, transistors, comparator, logic elements, diodes, resistors, capacitors, etc.

Another method of generating dither, rather than as an analog signal, would be phase dithering of ramp start with respect to the high frequency clock which is accumulated in the data counter. This might be accomplished by deriving the START signal from a totally independent clock source.

Other methods of employing the correction signal at the output of the integrator 100, following the flip-flop which reflects the digital output polarity following STAB intervals, include leaving the ramp generator undisturbed and employing this correction signal as (a) an additional analog input to the comparator summing point, or (b) a vernier voltage input to a voltage controlled oscillator which would replace the crystal oscillator supplying the high frequency clock to the converter.

The following aspects of the SRC are believed to be new:

(a) The technique of periodic selection of a signal ground at lines 28 and 36 as an input to the converter 10 and the employment of the converter's average digital measurement of this signal as indicated on line 63 to compensate for initial offset and offset drift in the input stage at buffer 20 of the converter 10, as well as for drift of the converter's internal parameters (e.g., ramp slope).

(b) The utilization of a multiplexed, essentially impulse sampled A/D converter to supply sequential outputs of shift register 82 at a fixed rate, which, if digitally accumulated, presents a result equivalent to the integral of the signal being converted, or by proper scaling and accumulator resetting, the long term average of that signal (as accomplished in integrating dc voltmeters).

(c) The introduction of a precise amplitude dither to minimize the effects of dead band between quantizing levels in the average of a series of conversions.

It will be apparent that the embodiment of the invention herein disclosed fulfills the objects of the invention, and is subject to modification without departing from the scope of the subjoined claims.

What is claimed is:

1. An analog-to-digital converter for an inertial navigation system comprising:
   an inertial navigation platform having a gyroscope and an accelerometer supplying a plurality of analog signals,
   a multiplexer connected to the gyroscope and the accelerometer for receiving one analog input signal from the plurality of analog signals,
   a timing unit coupled to the multiplexer for selecting the one analog input signal,
   a comparator having an input connected to the multiplexer,
   a feedback stabilized ramp generator having an output connected to the comparator input and having a feedback input,
   a gated counter connected to and controlled by the comparator for supplying a digital output which is representative of the platform analog signal,
   a feedback line connected between the gated counter and the feedback input of the stabilized ramp generator,
   a dither generator connected to the comparator input,
   a buffer having an input connected to the multiplexer and an output connected to the comparator, and
   a reference generator connected to the stabilized ramp generator and connected to the dither generator.

2. The converter of claim 1, wherein the stabilized ramp converter includes:
   a D-type control flip flop connected to the feedback line from the gated counter,
   an open collector inverter connected to the D-type control flip flop,
   an integrator amplifier connected to the open collector inverter, and
   a summing amplifier connected to the integrator amplifier and connected to the comparator input.

3. The converter of claim 2, wherein the gated counter includes:
a flip flop coupled to the timing unit and connected to the comparator,
a gate coupled to the timing unit and connected to the flip flop for supplying the counter and
a shift register coupled to the timing unit for receiving data from the counter.

* * * * *